(12) United States Patent
Jang et al.

(10) Patent No.: US 6,180,049 B1
(45) Date of Patent: Jan. 30, 2001

(54) LAYER MANUFACTURING USING FOCUSED CHEMICAL VAPOR DEPOSITION

(75) Inventors: Bor Z. Jang; Junsheng Yang, both of Auburn, AL (US)

(73) Assignee: Nanotek Instruments, Inc., Opelika, AL (US)

( * ) Notice: Under 35 U.S.C. 154(b), the term of this patent shall be extended for 0 days.

(21) Appl. No.: 09/340,887

(22) Filed: Jun. 28, 1999

(51) Int. Cl.[7] ............................ B29C 35/08; B29C 41/02; C23C 16/00
(52) U.S. Cl. ...................... 264/401; 118/694; 118/723 R; 118/723 FE; 118/723 FI; 118/729; 264/81; 264/497; 425/174.4; 427/9; 427/255.28; 427/255.5; 427/585; 700/119; 700/120
(58) Field of Search .......................... 264/81, 401, 497; 425/174.4; 427/9, 255.28, 255.5, 585; 118/694, 723 R, 723 FE, 723 FI, 729; 700/119, 120

(56) References Cited

U.S. PATENT DOCUMENTS

| | | |
|---|---|---|
| 4,665,492 | 5/1987 | Masters . |
| 4,863,538 | 9/1989 | Deckard . |
| 4,944,817 | 7/1990 | Bourell et al. . |
| 4,948,623 | 8/1990 | Beach et al. . |
| 5,017,317 | 5/1991 | Marcus . |
| 5,059,266 | 10/1991 | Yamane et al. . |
| 5,135,695 | 8/1992 | Marcus . |
| 5,136,515 | 8/1992 | Helinski . |
| 5,140,937 | 8/1992 | Yamane et al. . |
| 5,169,579 | 12/1992 | Marcus et al. . |
| 5,171,360 | 12/1992 | Orme et al. . |
| 5,216,616 | 6/1993 | Masters . |
| 5,257,657 | 11/1993 | Gore . |
| 5,301,863 | 4/1994 | Prinz et al. . |
| 5,306,447 | 4/1994 | Marcus et al. . |
| 5,555,176 | 9/1996 | Menhennet et al. . |
| 5,611,883 | 3/1997 | Thompkins et al. . |
| 5,617,911 | 4/1997 | Sterett . |
| 5,888,591 | 3/1999 | Gleason . |

*Primary Examiner*—Leo B. Tentoni (57) ABSTRACT

A solid freeform fabrication process and apparatus for making a three-dimensional object. The process includes the steps of (1) positioning a material deposition sub-system a selected distance from a target surface, (2) operating this sub-system to deposit materials onto the target surface by carrying out the sub-steps of (a) operating a multiple-channel fluid phase delivery device of the deposition sub-system for supplying multiple fluid compositions to a small region proximate the target surface and (b) operating a focused energy source to produce a phase change zone at this region, thereby inducing deposition of materials onto the target surface, and (3) during the material deposition process, moving the deposition sub-system and the target surface relative to one another in a plane defined by first and second directions and in a third direction orthogonal to this plane to form deposition materials into a three dimensional shape. These steps are preferably executed under the control of a computer system. Preferably, the system is also operated to generate a support structure for any unsupported feature of the object.

27 Claims, 6 Drawing Sheets

LAYER MANUFACTURING USING FOCUSED CHEMICAL VAPOR DEPOSITION

FIELD OF THE INVENTION

This invention relates generally to a computer-controlled object-building system and, in particular, to an improved layer manufacturing system for building a three-dimensional object such as a model, molding tool, microelectronic device and micro-electromechanical system (MEMS).

BACKGROUND OF THE INVENTION

Solid freeform fabrication (SFF) or layer manufacturing is a new rapid prototyping and manufacturing technology. A SFF system builds an object layer by layer or point by point under the control of a computer. The process begins with creating a Computer Aided Design (CAD) file to represent the desired object. This CAD file is converted to a suitable format, e.g. stereo lithography (.STL) format, and further sliced into a large number of thin layers with the contours of each layer being defined by a plurality of line segments connected to form vectors or polylines. The layer data are converted to tool path data normally in terms of computer numerical control (CNC) codes such as G-codes and M-codes. These codes are then utilized to drive a fabrication tool for building an object layer by layer.

The SFF technology has found a broad range of applications such as verifying CAD database, evaluating design feasibility, testing part functionality, assessing aesthetics, checking ergonomics of design, aiding in tool and fixture design, creating conceptual models and sales/marketing tools, generating patterns for investment casting, reducing or eliminating engineering changes in production, and providing small production runs. Although most of the prior-art SFF techniques are capable of making 3-D form models on a macroscopic scale, few are able to directly produce a microelectronic device or micro-electromechanical system (MEMS) that contains micron- or nano-scale functional elements.

In U.S. Pat. No. 4,665,492, issued May 12, 1987, Masters teaches part fabrication by spraying liquid resin droplets, a process commonly referred to as Ballistic Particle Modeling (BPM). The BPM process includes heating a supply of thermoplastic resin to above its melting point and pumping the liquid resin to a nozzle, which ejects small liquid droplets from different directions to deposit on a substrate. Patents related to the BPM technology can also be found in U.S. Pat. No. 5,216,616 (June 1993 to Masters), U.S. Pat. No. 5,555,176 (September 1996, Menhennett, et al.), and U.S. Pat. No. 5,257,657 (November 1993 to Gore). Sanders Prototype, Inc. (Merrimack, N.H.) provides inkjet print-head technology for making plastic or wax models. Multiple-inkjet based rapid prototyping systems for making wax or plastic models are available from 3D Systems, Inc. (Valencia, Calif.). Model making from curable resins using an inkjet print-head is disclosed by Yamane, et al. (U.S. Pat. No. 5,059,266, October 1991 and U.S. Pat. No. 5,140,937, August 1992) and by Helinski (U.S. Pat. No. 5,136,515, August 1992). Inkjet printing involves ejecting fine polymer or wax droplets from a print-head nozzle that is either thermally activated or piezo-electrically activated. The droplet size typically lies between 30 and 50 $\mu$m, but could go down to 13 $\mu$m. This implies that inkjet printing offers a part accuracy on the order of 13 $\mu$m or worse which, for the most part, is not adequate for the fabrication of microelectronic devices.

Methods that involve deposition of metal parts from a steam of liquid metal droplets are disclosed in Orme, et al (e.g., U.S. Pat. No. 5,171,360) and in Sterett, et al. (U.S. Pat. No. 5,617,911). The method of Orme, et al involves directing a stream of a liquid material onto a collector of the shape of the desired product. A time dependent modulated disturbance is applied to the stream to produce a liquid droplet stream with the droplets impinging upon the collector and solidifying into a unitary shape. The method of Sterett, et al entails providing a supply of liquid metal droplets with each droplet being endowed with a positive or negative charge. The steam of liquid droplets is focused by passing these charged droplets through an alignment means, e.g., an electric field, to deposit on a target in a predetermined pattern. The deflection of heavy droplets of liquid metal by an electric field is not easy to accomplish. Further, a continuous supply of liquid metal droplets may make it difficult to prevent droplets from reaching "negative" regions (which are not portions of a cross-section of the object). A mask will have to be used to collect these un-desired droplets.

In U.S. Pat. No. 5,301,863 issued on Apr. 12, 1994, Prinz and Weiss disclose a Shape Deposition Manufacturing (SDM) system. The system contains a material deposition station and a plurality of processing stations (for mask making, heat treating, packaging, complementary material deposition, shot peening, cleaning, shaping, sand-blasting, and inspection). Each processing station performs a separate function such that when the functions are performed in series, a layer of an object is produced and is prepared for the deposition of the next layer. This system requires an article transfer apparatus, a robot arm, to repetitively move the object-supporting platform and any layers formed thereon out of the deposition station into one or more of the processing stations before returning to the deposition station for building the next layer. These additional operations in the processing stations tend to shift the relative position of the object with respect to the object platform. Further, the transfer apparatus may not precisely bring the object to its exact previous position. Hence, the subsequent layer may be deposited on an incorrect spot, thereby compromising part accuracy. The more processing stations that the growing object has to go through, the higher the chances are for the part accuracy to be lost. Such a complex and complicated process necessarily makes the over-all fabrication equipment bulky, heavy, expensive, and difficult to maintain. The equipment also requires attended operation.

The selected laser sintering or SLS technique (e.g., U.S. Pat. No. 4,863,538 issued in September 1989 to Deckard and U.S. Pat. No. 4,944,817 issued July 1990 to Bourell, et al.) involves spreading a full-layer of powder particles and uses a computer-controlled, high-power laser to partially melt these particles at desired spots. Commonly used powders include thermoplastic particles or thermoplastic-coated metal and ceramic particles. The procedures are repeated for subsequent layers, one layer at a time, according to the CAD data of the sliced-part geometry.

In a series of U.S. Patents (U.S. Pat. No. 5,017,317 in May 1991; U.S. Pat. No. 5,135,695 in August 1992; U.S. Pat. No. 5,169,579 in December 1992; U.S. Pat. No. 5,306,447 in April 1994; U.S. Pat. No. 5,611,883 in March 1997), Marcus and co-workers have disclosed a selected area laser deposition (SALD) technique for selectively depositing a layer of material from a gas phase to produce a part composed of a plurality of deposited layers. The SALD apparatus includes a computer controlling and directing a laser beam into a chamber containing the gas phase. The laser causes decomposition of the gas phase and selectively deposits material within the boundaries of the desired cross-sectional regions of the part. A major advantage of this technique is that it is capable of depositing a wide variety of materials to form an object on a layer by layer basis. The prior art SALD technique, however, is subject to the following shortcomings:

(1) Just like most of the prior-art layer manufacturing techniques, the SALD technique is largely limited to producing parts with homogeneous material compositions. Although, in principle, SALD allows for variations in the material composition from layer to layer, these variations can not be easily accomplished with the prior art SALD apparatus. For instance, upon completion of depositing a layer, the remaining gas molecules must be evacuated out of the build chamber, which is then filled with a second gas phase composition. This would be a slow and tedious procedure.

(2) The prior art SALD technique does not readily permit variations in the material composition from spot to spot in a given layer. This is due to the fact that the chamber is filled with a gas phase of an essentially uniform composition during the formation of a specific layer. In other words, the laser beam only decomposes one specific gas composition, leading to the deposition of a uniform-composition layer. In many applications (e.g., "direct writing" or deposition of a microelectronic device) material compositions vary as a function of spatial locations.

(3) The prior art SALD technique has poor resolution, precision or accuracy. The deposition spot size could not be smaller than the laser beam spot size, which is normally quite large. It is difficult to produce micron or sub-micron scale deposition spots with prior art SALD.

In U.S. Pat. No. 4,615,904 issued in October 1986, Ehrlich, et al. disclose a method of growing patterned films on a substrate in a deposition chamber. The method consists of the following steps: (1) pressurizing the chamber with a fluid medium to form a thin absorption layer on the substrate, (2) evacuating the chamber to remove excess fluid medium, (3) pre-nucleating portions of the substrate with a focused energy beam, (4) re-pressurizing the chamber with a fluid medium, and (5) inducing deposition of material from the liquid medium. This method permits growth of a patterned film with deposition occurring primarily on the pre-nucleated portions of the substrate. This method suffers from substantially the same drawbacks as with SALD.

Therefore, an object of the present invention is to provide an improved layer-additive process and apparatus for producing an object with high part accuracy.

Another object of the present invention is to provide a computer-controlled process and apparatus for producing a multi-material 3-D object on a layer-by-layer basis.

Still another object of the present invention is to provide a computer-controlled process and apparatus capable of producing multiple-layer microelectronic devices.

It is another object of this invention to provide a process and apparatus for building a CAD-defined object in which the material composition distribution can be predetermined.

Still another object of this invention is to provide a layer manufacturing technique that places minimal constraint on the range of materials that can be used in the fabrication of a 3-D object.

SUMMARY OF THE INVENTION
The Process

The objects of the invention are realized by a process and related apparatus for fabricating a three-dimensional object on a layer-by-layer basis. In one preferred embodiment, the process comprises operating a material-deposition sub-system which comprises a multi-channel fluid phase delivery device, each channel having a small-sized orifice for dispensing a desired fluid phase at a predetermined flow rate. The flow of a fluid phase from an orifice to a selected spot on a target surface forms a travel path. The material deposition sub-system further comprises a focused energy beam, such as a laser beam. The energy beam intersects the travel path of the fluid phase to form a phase change zone in which the fluid phase is activated to undergo at least a chemical reaction and/or physical transition so that a material is deposited on a target surface proximate this phase change zone.

First, at least a first fluid phase is dispensed and activated to deposit a first volume of deposition material at a first focused spot of the target surface. The process further comprises operating motion devices so that the target surface is moved relative to the material deposition sub-system in a direction on an X-Y plane defined by a first (X-) direction and second (Y-) direction. During this movement operation, a second fluid phase, of the same or different material composition, is dispensed and activated for depositing a second volume of deposition material to a second focused area of the target surface. These procedures are repeated by using a CAD computer to control the relative movement between the target surface and the material deposition sub-system in selected directions on the X-Y plane to trace out the cross-section of a first layer of the desired object. The material deposition sub-system is then shifted by a predetermined distance away from the target surface in a Z-direction, perpendicular to the X-Y plane. These X-Y-Z directions form a Cartesian coordinate system. These procedures are then repeated under the control of the CAD computer to deposit consecutive layers in sequence, with each subsequent layer adhering to a preceding layer, thereby forming the desired multiple-layer 3-D object.

Preferably, the above steps are attendant with additional steps of forming multiple layers of an inert material (e.g., an electrically insulating material for a multi-layer microelectronic device or a low melting temperature material for the case of a 3-D model) on top of one another to form a protective structure or support structure for an un-supported feature of the object such as an overhang or isolated island. A support structure may either occupy just a selected area of an individual layer or fully cover the remaining area of a layer otherwise unoccupied by the laser-deposited materials. In each layer, the laser-deposited material areas as a portion of an object are referred to as the "positive region" and the remaining unoccupied area is "negative region". The support material in the negative region can be deposited by using a separate material-dispensing tool such as an extrusion nozzle, inkjet print-head, or plasma sprayer.

Further preferably, the above cited steps are executed under the control of the CAD computer by taking the following specific procedures: (1) creating a geometry of the three-dimensional object on a computer with the geometry including a plurality of segments defining the object; (2) generating programmed signals corresponding to each of the segments in a predetermined sequence; and (3) moving the deposition sub-system and the target surface relative to each other in response to the programmed signals. To build a multi-material object, each segment is preferably attached with a material composition code that can be converted to programmed signals for activating the deposition of selected material compositions to form a desired material distribution of the finished object. Further preferably, the supporting software programs in the computer comprise means for evaluating the CAD data files of the object to locate any un-supported feature of the object and means for defining a support structure for the un-supported feature. The software is also capable of creating a plurality of segments defining the support structure and generating programmed signals required by a separate deposition tool to fabricate the support structure.

The Apparatus

One embodiment of this invention is an apparatus comprising a material deposition sub-system, a target surface, motion devices and associated machine controller/indexer, and a computer. The material deposition sub-system is composed of three major components: a multi-channel fluid phase delivery device, a focused energy beam (a laser beam, e.g.), and optionally a separate dispensing tool for depositing a support structure.

The fluid phase delivery device comprises a multiplicity of flow channels. Each channel has at least two ends, first end being in flow communication with a source of fluid phase and second end having a discharge orifice of a predetermined size for dispensing the fluid phase. The fluid phase composition is such that it can be thermally or photochemically decomposed or simply made to undergo a phase change for depositing a material onto the target surface. The delivery device also comprises valve means located in control relation to these channels for regulating the flow of a fluid phase through these discharge orifices. The discharge orifices are preferably small in size, micron or nanometer scaled as desired. Different channels may be supplied with different fluid phase compositions so that one fluid phase composition or a mixture of fluid phase compositions is discharged and activated by the laser beam at a time to induce the focused deposition of a small amount of material on a target spot. This multi-channel arrangement readily allows for variations in the material composition so that the spatial distribution of materials in each layer can be predetermined and well controlled.

The dispensed fluid phase is directed to form a travel path from an orifice to a selected spot on a target surface or a preceding layer already deposited. The focused energy beam, preferably comprising a laser beam, is disposed in working proximity to the target surface. The beam intersects the fluid phase travel path, creating a small phase change zone proximate the target surface where a chemical reaction (e.g., chemical vapor decomposition) or physical phase change (solidification) is induced to take place, resulting in deposition of a solid material onto the target surface or a previously deposited layer.

The target surface is generally flat and is located in close, working proximity to the discharge orifices of the deposition sub-system to receive discharged/deposited materials therefrom. The motion devices are coupled to the target surface and the material deposition sub-system for moving the deposition sub-system and the target surface relative to one another along selected directions in the X-Y plane and in the Z-direction. If necessary, the fluid delivery device and the laser beam may be attached together to move congruently or as an integral unit. Preferably, however, this material deposition sub-system, comprising the fluid phase delivery device plus the focused energy beam, is allowed to remain stationary while the target surface is controlled to move in the X-Y-Z directions. The motion devices are preferably controlled by a computer system for positioning the deposition sub-system with respect to the target surface in accordance with a CAD-generated data file representing the object. Further preferably, the same computer is used to regulate the operations of the material deposition sub-system in such a fashion that materials of predetermined compositions are dispensed in predetermined sequences.

The target surface may be provided with a controlled atmosphere wherein the temperature, pressure (including vacuum conditions), and gas composition can be regulated to facilitate deposition and to protect against possible metal oxidation. Preferably, sensor means are provided to periodically measure the dimensions of an object being built and send the acquired dimension data to the CAD computer so that new sets of logical layers may be re-calculated when necessary.

Advantages of the Invention

The process and apparatus of this invention have several features, no single one of which is solely responsible for its desirable attributes. Without limiting the scope of this invention as expressed by the claims which follow, its more prominent features will now be discussed briefly. After considering this brief discussion, and particularly after reading the section entitled "DESCRIPTION OF THE PREFERRED EMBODIMENTS" one will understand how the features of this invention offer its advantages, which include:

(1) The present invention provides a unique and novel process for producing a three-dimensional object on a layer-by-layer basis under the control of a computer. Due to the small size of the laser-fluid phase interaction zone or phase change zone, this process is amenable to the fabrication of a microelectronic device or microelectromechanical system (MEMS) device.

(2) Most of the prior-art layer manufacturing methods, including selected area laser deposition (SALD) and powder-based techniques such as 3-D printing (3DP) and selective laser sintering (SLS), are normally limited to the fabrication of an object with a uniform material composition. Although the prior art SALD method (e.g., as suggested in U.S. Pat. No. 5,017,317) allows for mixing a plurality of gas phases in a chamber and, thereby, forming a composite material part on a target surface through laser-induced chemical vapor deposition, the material compositions of such a composite part could not be spatially controlled. In contrast, the presently invented process readily allows for the fabrication of an object having a spatially controlled material composition comprising two or more distinct types of material. For example, functionally gradient components can be readily fabricated with the present method.

(3) The presently invented method provides a layer-additive process which places minimal constraint on the variety of materials that can be processed. The fluid phase compositions may be selected from a broad array of materials.

(4) The present invention makes it possible to directly produce net-shaped functional parts of intended materials (not just models or prototypes), thus eliminating intermediate or secondary processing steps such as final sintering or re-impregnation required of 3DP and SLS. This feature enables this new technology to offer dramatic reductions in the time and cost required to realize functional parts.

(5) The method can be embodied using simple and inexpensive mechanisms, so that the fabricator equipment can be relatively small, light, inexpensive and easy to maintain.

BRIEF DESCRIPTION OF THE DRAWINGS

FIG. 2. (A) Schematic of an example of a multi-channel fluid-phase delivery device, (B) Bottom of this delivery device.

DESCRIPTION OF THE PREFERRED EMBODIMENTS

Figure 1:
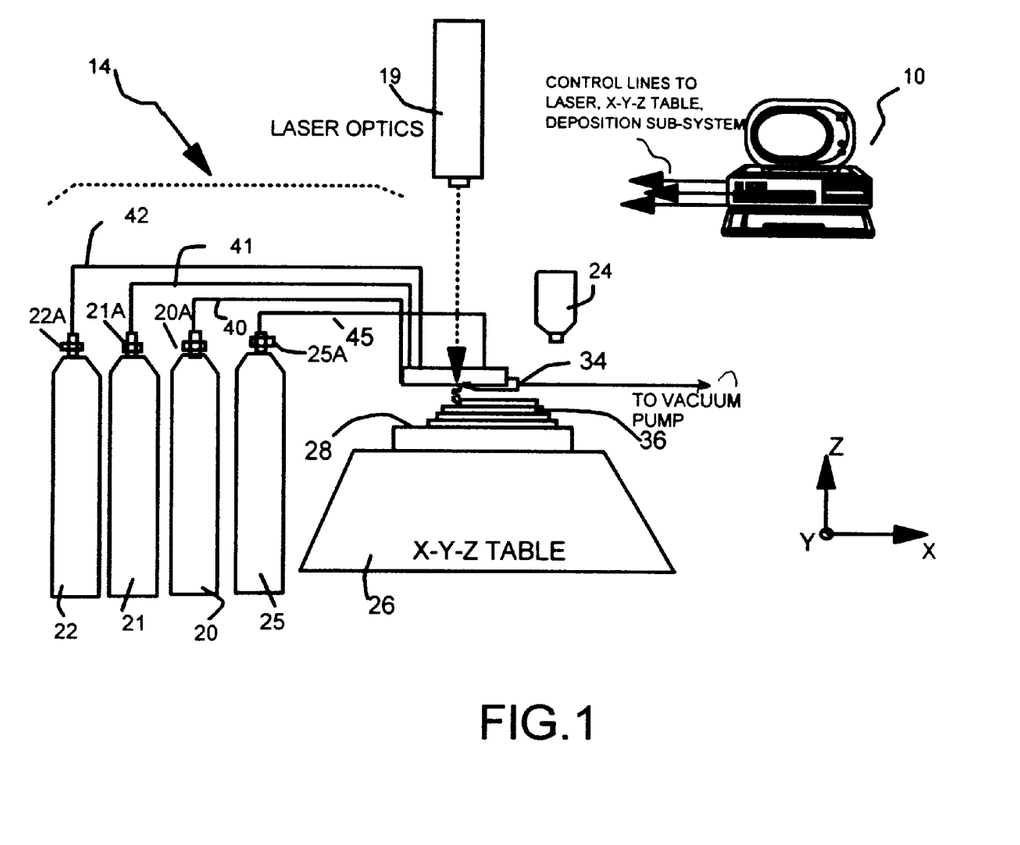
FIG. 1. Schematic of an apparatus for building a 3-D object on a layer-by-layer basis, comprising a multi-channel fluid-dispensing device assisted by a laser beam, a target surface capable of moving in an X-Y plane and in an orthogonal Z-axis in a desired sequence, and a computer control system.

In the drawings, like parts have been endowed with the same numerical references. FIG. 1 illustrates one embodiment of the apparatus of this invention for making three-dimensional objects. This apparatus is equipped with a computer 10 for creating an image of an object and, through a hardware controller (including signal generator, amplifier, and other needed functional parts) for controlling the operation of other components of the apparatus. One of these components is a material deposition sub-system which comprises a multiple-channel fluid phase delivery device 14, a directed energy beam such as a laser beam from a laser optic system 19, and a separate material dispensing tool 24 for building a support structure.

Other components of the apparatus include a target surface 28, optional temperature-regulating means (not shown), pumping and/or gas pressurizing means (not shown) to control the atmosphere of a zone surrounding the target surface where a part 36 is being built, and a three dimensional movement system (e.g., an X-Y-Z gantry table 26) to position the target surface 28 with respect to the material deposition sub-system in a direction on an X-Y plane and in a Z-direction. The X-Y plane and Z-direction define a Cartesian coordinate system.

The Material Deposition Sub-System

The material deposition sub-system comprises a fluid phase delivery device, a focused energy beam and, preferably, also a separate material dispensing tool for depositing a support structure.

Figure 2A:
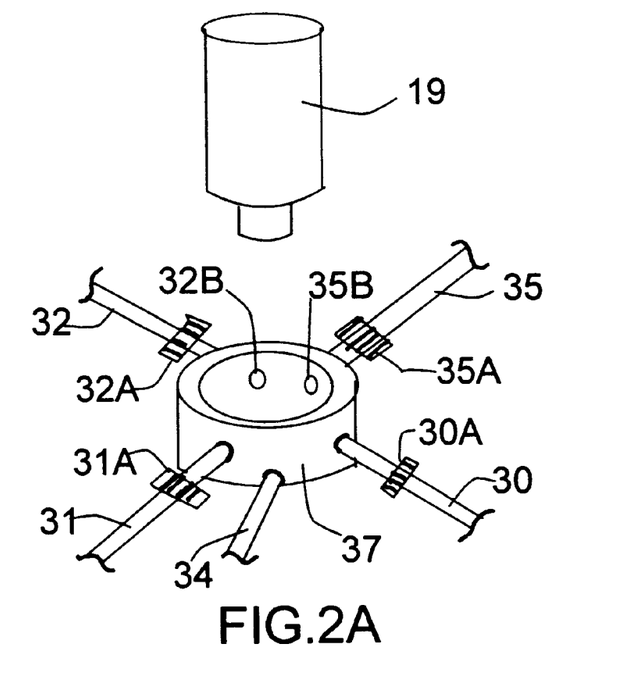
Figure 2B:
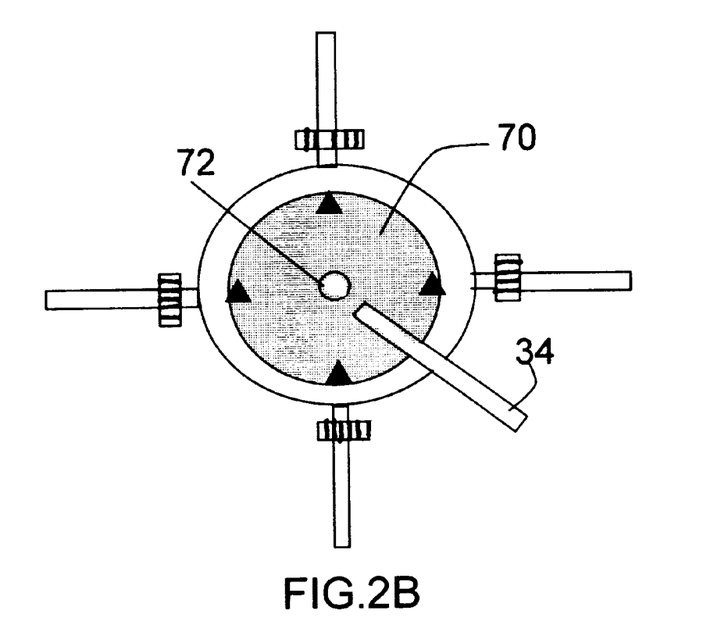

In one preferred embodiment, as shown in FIG. 1 and FIG. 2, the fluid phase delivery device comprises: (1) a multiplicity of flow channels (e.g., 30, 31, 32, 35) with each channel having first and second ends. The first end is supplied with a precursor fluid phase composition (e.g., contained in bottles 20, 21, 22, 25 indicated in FIG. 1) and the second end has a discharge orifice (e.g., 32B, 35B in FIG. 2) of a predetermined size through which the fluid phase composition is dispensed; and (2) valve/switch means (e.g., 30A, 31A, 32A, 35A) located in control relation to each of the channels for regulating the flow of the gas phase compositions through the discharge orifices.

As shown in FIG. 1, the fluid phase compositions are supplied from their respective containers (e.g., gas bottles 20, 21, 22, 25) through pipes or tubings 40, 41, 42, 45 into their respective nozzles or input channels 30, 31, 32, 35 (FIG. 2). Preferably, the flow of these fluid phase compositions is regulated by valves 20A, 21A, 22A, 25A at tops of the bottles and by valves or switches 30A, 31A, 32A, 35A near the nozzle orifices (e.g., 32B, 35B in FIG. 2). The orifice sizes are preferably micron-scaled or nanometer-scaled. Preferably, the orifices are orientated in such a manner that the dispensed fluid phase is directed to flow to a focused spot proximate the target surface. To achieve such a purpose, the fluid phase compositions are directed to flow into a small chamber 37 containing the phase change zone. This zone is defined by the intersection of the laser beam and the travel path of the discharged fluid phase. This phase change chamber 37 preferably has an interchangeable bottom plate 70 having an opening 72 of a predetermined size. This bottom plate can be easily changed to vary the size of the opening 72. The opening size is preferably smaller than 1 mm in diameter; further preferably micron- (e.g., smaller than 10 $\mu$m in diameter or lateral dimension) or nanometer-scaled. A flow facilitator (e.g., a vacuum tubing 34 connected to a vacuum pump) may be positioned near or at the bottom plate 70 to help direct the flow of the fluid compositions, moving toward a selected focused spot on the target surface, and to remove the waste gases. The orientations of the nozzle orifices and the discharge opening 72, along with the flow facilitator constitute an effective flow control system (means).

Figure 3:
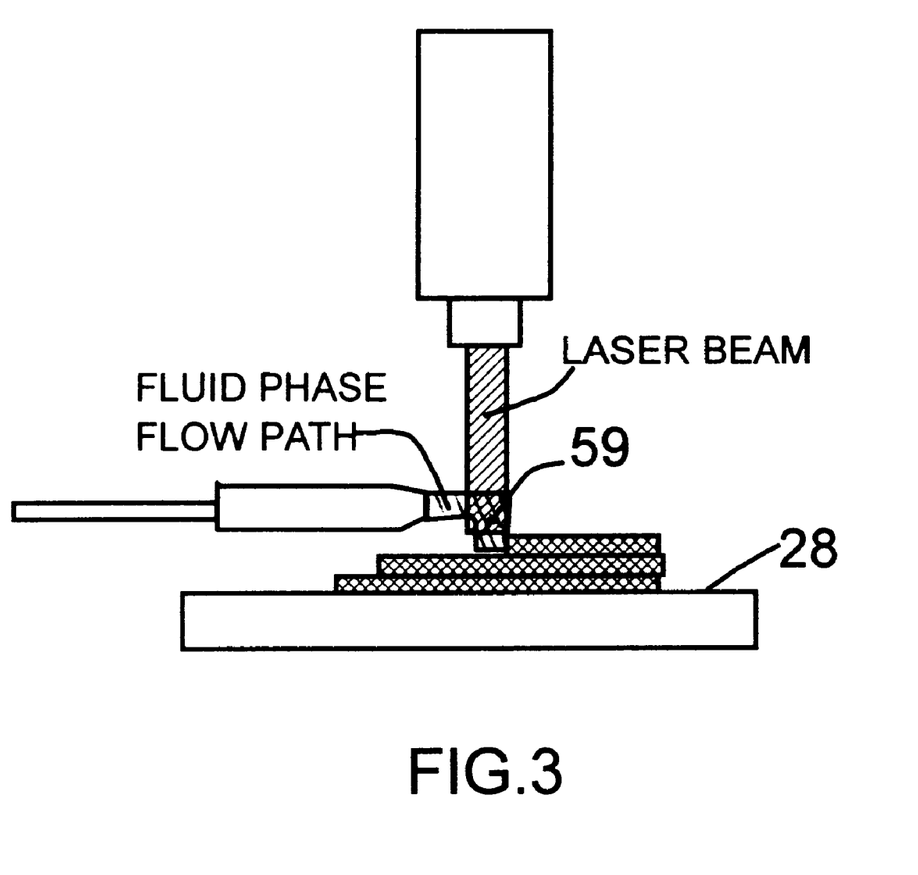
FIG. 3. Schematic drawing showing the laser beam and the fluid phase flow path intersect to form an interaction zone (phase change zone).

The focused energy beam is disposed in working proximity to the target surface and operative to produce a phase change zone near the above-said focused spot for effecting deposition of a material onto the target surface. This energy beam can comprise a laser beam, an electron beam, an ion beam, and a focused plasma beam. Using a laser beam as an example, FIG. 3 indicates that the fluid phase flow path and the laser beam intersects to form an interaction zone (hereinafter referred to as a phase change zone 59) where a chemical reaction and/or physical phase transition can be induced to occur. The chemical reactions that could occur include but are not limited to thermal decomposition, photo-decomposition, and photo-thermal decomposition. The phase transitions include but are not limited to condensation, solidification, and crystallization. These reactions and/or phase transitions result in the deposition of a solid phase onto a spot of the target surface proximate this phase change zone. This deposition spot size is approximately equal to the phase change zone size, which is governed by the fluid phase flow size and the laser beam size whichever being smaller. This feature implies that the deposition spot size, which essentially controls the part accuracy, can be controlled by varying either the laser beam size or the fluid phase flow size. This is in sharp contrast to the prior art SALD system, in which a laser beam size only dictates the deposition spot size because the target surface is enclosed in a big chamber filled with reactive gases.

Figure 4:
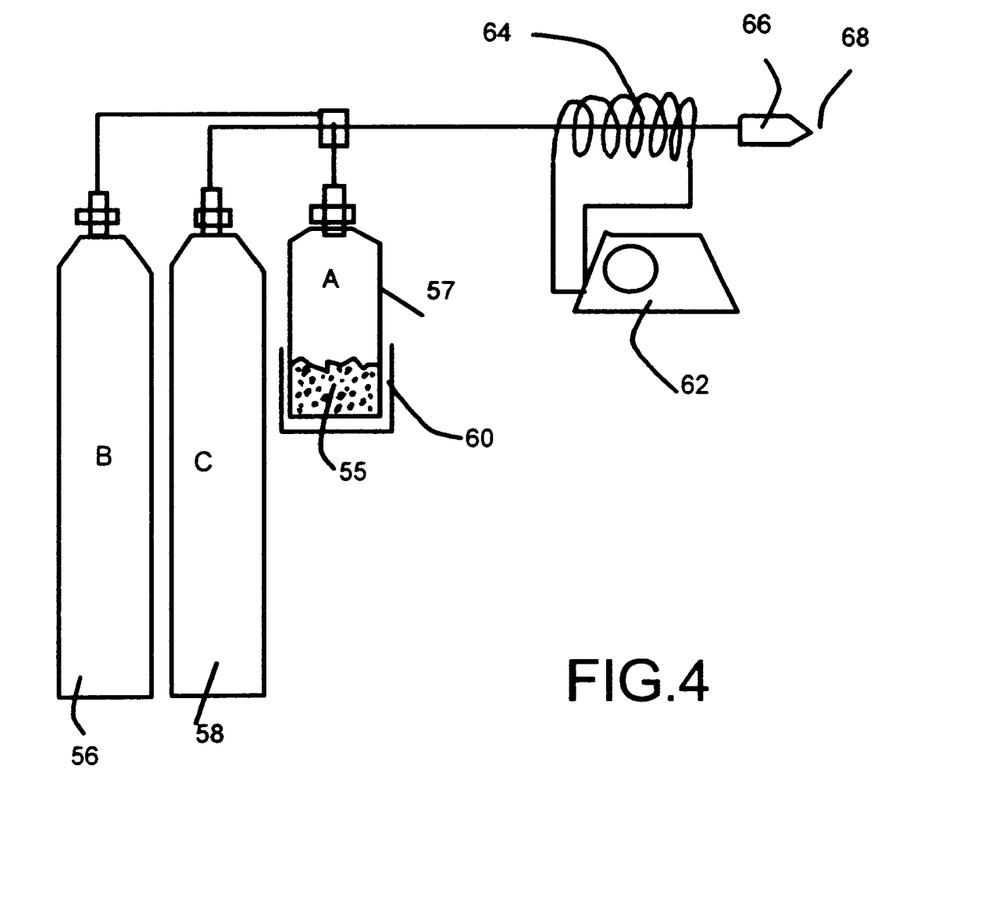
FIG. 4. An example of a plasma fluid phase delivery device.

In the case of a focused plasma beam, FIG. 4, an organic or organometallic vapor A may be introduced from a container 57, via the assistance of a carrier gas C from gas bottle 58, to a microwave- or radio frequency-promoted excitation zone 64 to produce a reactive plasma. This plasma is directed to flow through a nozzle 66 and discharged through orifice 68 to a phase change zone for producing solid deposition onto a focused spot of the target surface. In one preferred embodiment, the excitation zone 64 features an electrical coil which is electronically connected to a microwave or radio frequency (RF) generator 62. If the precursor fluid composition 55 is a liquid or solid, it may be vaporized via heating (60 being a heater means). In some cases, additional precursor fluid compositions (e.g., B from bottle 56) may be mixed with fluid composition A to obtain a multi-composition plasma.

Target Surface

Referring again to FIG. 1, the target surface 28 may be a substrate or platen supported by an X-Y-Z gantry table 26. The substrate can be a polymer, metal, glass, ceramic, composite material, or a combination thereof. The target surface is located in close, working proximity to the dispensing orifices of the material deposition sub-system. The upper surface of the target surface preferably has a flat region sufficiently large to accommodate the first few layers of the deposited material. The target surface 28 and the material deposition sub-system are equipped with mechanical drive means for moving the target surface relative to the deposition device in three dimensions along the X-, Y-, and Z-axes in a rectangular coordinate system in a predetermined sequence and pattern, and for displacing the deposition sub-system a predetermined incremental distance relative to the target surface. This can be accomplished, for instance as shown in FIG. 1, by allowing the target surface to be driven by an X-Y-Z gantry table while maintaining the deposition sub-system stationary.

Alternatively, the deposition sub-system may be driven by three linear motion devices, which are powered by three stepper motors to provide movements along the X-, Y-, and Z-directions, respectively. Z-axis movements are executed to displace the target surface 28 relative to the material deposition sub-system or to displace the deposition subsystem relative to the target surface and, hence, relative to each layer deposited prior to the start of the formation of each successive layer. In another alternative arrangement, the deposition sub-system may be mounted in a known fashion for movement in the X-Y plane, with the target surface 28 supported for separate movement toward and away from the deposition sub-system along the Z-direction. Alternatively, the work surface may be supported for movement in the X-Y plane, with the deposition sub-system mounted for separate movement along the Z-direction toward and away from the work surface.

Motor means are preferably high resolution reversible stepper motors, although other types of drive motors may be used, including linear motors, servomotors, synchronous motors, D.C. motors, and fluid motors. Mechanical drive means including linear motion devices, motors, and gantry type positioning stages are well known in the art.

These movements will make it possible for the deposition sub-system to deposit and form multiple layers of materials of predetermined thickness, which build up on one another sequentially as the material solidifies after being discharged from the orifice to go through the phase change zone.

Heating and cooling means (e.g., heating elements, cooling coils, thermocouple, and temperature controller; not shown) may be provided to a region surrounding the target surface 28 to control the phase change and deposition behavior of the material on the target surface.

Figure 5:
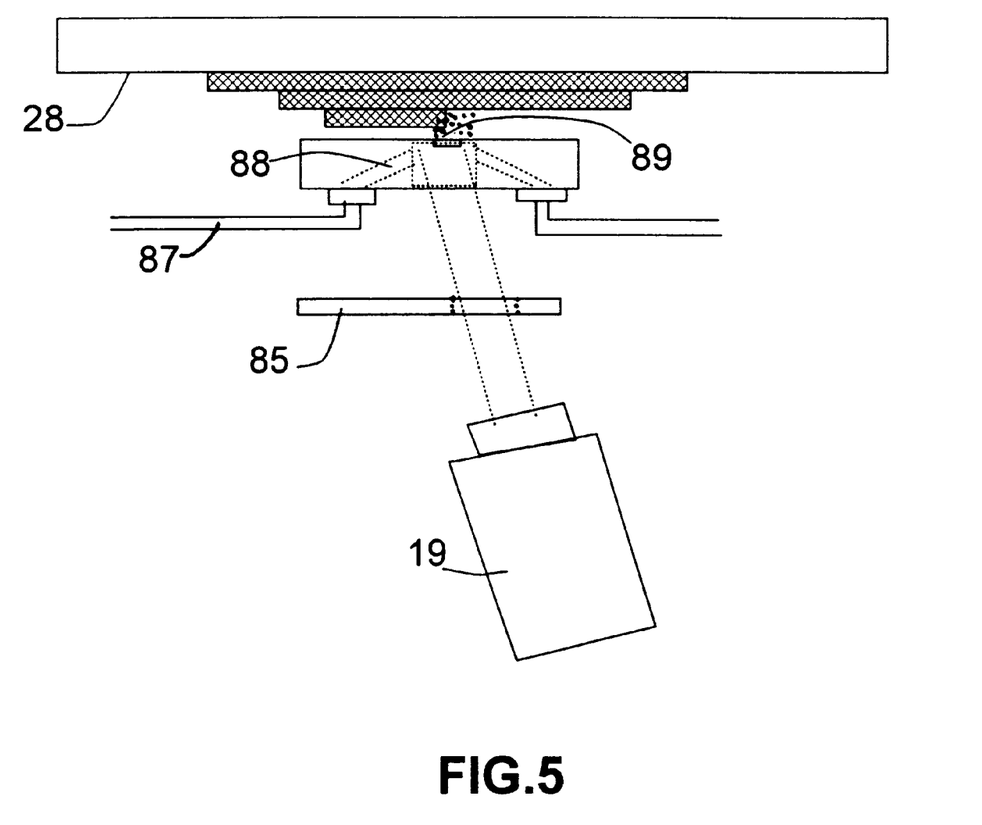
FIG. 5. Schematic drawing of a fluid-phase delivery device positioned below a target surface.

In another preferred embodiment of the present invention, as schematically shown in FIG. 5, the material deposition sub-system may be positioned below the bottom surface 28 of a substrate. The fluid phase (e.g., from channel 87 through a tilted path 88) after being discharged from an orifice is directed to flow generally upward through an orifice 89 to strike on the bottom surface 28 (target surface) of a substrate. The focused energy beam could come from the side way (approximately 0 degree), but preferably from below in a substantially vertical direction (e.g., approximately 80 degrees). This inverted configuration has the following advantages: Only the desired active species that are capable of adhering to the target surface or a previous layer are allowed to deposit. The undesired species such as those that are non-sticking or incompatible would not have an opportunity to be incorporated in the object due to the gravitational force (that otherwise would drive the species downward in the case of up-facing arrangement, as shown in FIG. 1). Instead, in the present case (FIG. 5), they would be allowed to naturally drop downward to a waste collector 85. Further, only the species that are directed to strike the target surface have a chance to stick to this surface, making it easier to have a focused deposition.

Sensor means may be attached to proper spots of the object work surface or the material deposition sub-system to monitor the physical dimensions of the physical layers being deposited. The data obtained are fed back periodically to the computer for re-calculating new layer data. This option provides an opportunity to detect and rectify potential layer variations; such errors may otherwise cumulate during the build process, leading to significant part inaccuracy. Many prior art dimension sensors may be selected for use in the present apparatus.

Materials

The present invention may be utilized to fabricate parts comprising single- or multicomponent metals, ceramics, polymers, composites and combinations thereof. The material composition may vary from point to point in a layer or change from layer to layer. The fluid phase compositions utilized as the precursor materials in the present invention may comprise a plurality of gases including but not limited to organometallic, hydrocarbon, chloride, fluoride, oxide, nitride or polymer precursor gases. It may be noted that the term fluid phase includes but is not limited to multicomponent gases and gas plasmas. Precursor gases that can be induced to undergo chemical vapor deposition (CVD) are commonplace; e.g., as given in U.S. Pat. No. 5,306,447. As an interesting example, given in U.S. Pat. No. 4,948,623 (August 1990), Beach, et al disclosed that Cu and group IB metals such as Ag and Au could be deposited from a cyclopentadienyl/metal complex via thermal CVD, photothermal deposition, and photochemical deposition. Gleason, et al (U.S. Pat. No. 5,888,591, March 1999) provided methods for CVD of fluorocarbon polymer thin films.

In a preferred embodiment, the fluid phase compositions comprise gas phase precursor and gas carrier materials and plasmas thereof including but not limited to one or more combinations of $CH_4$, $C_2H_2$, $C_2H_4$, $C_2H_6$, $YCO_2$, $Al_2(CH_3)_6$, $H_2$, He, Ar, $Ni(CO)_4$, $Fe(CO)_5$, $N_2O$, $SiH_4$, $Si_2H_6$, $TiCl_4$, $BCl_3$ and $WF_6$. The decomposition of these gas phases leads to the deposition of one or more combinations of the following materials: diamond, graphitic carbon, amorphous carbon, TiN, $Ti_4C_3$, SiC, $Si_3N_4$, $SiO_2$, $TiB_2$, Ni, Al, Fe, W, Si, $Al_2O_3$, $TiO_2$ and TiC.

Mathematical Modeling and Creation of Logical Layers

Figure 6:
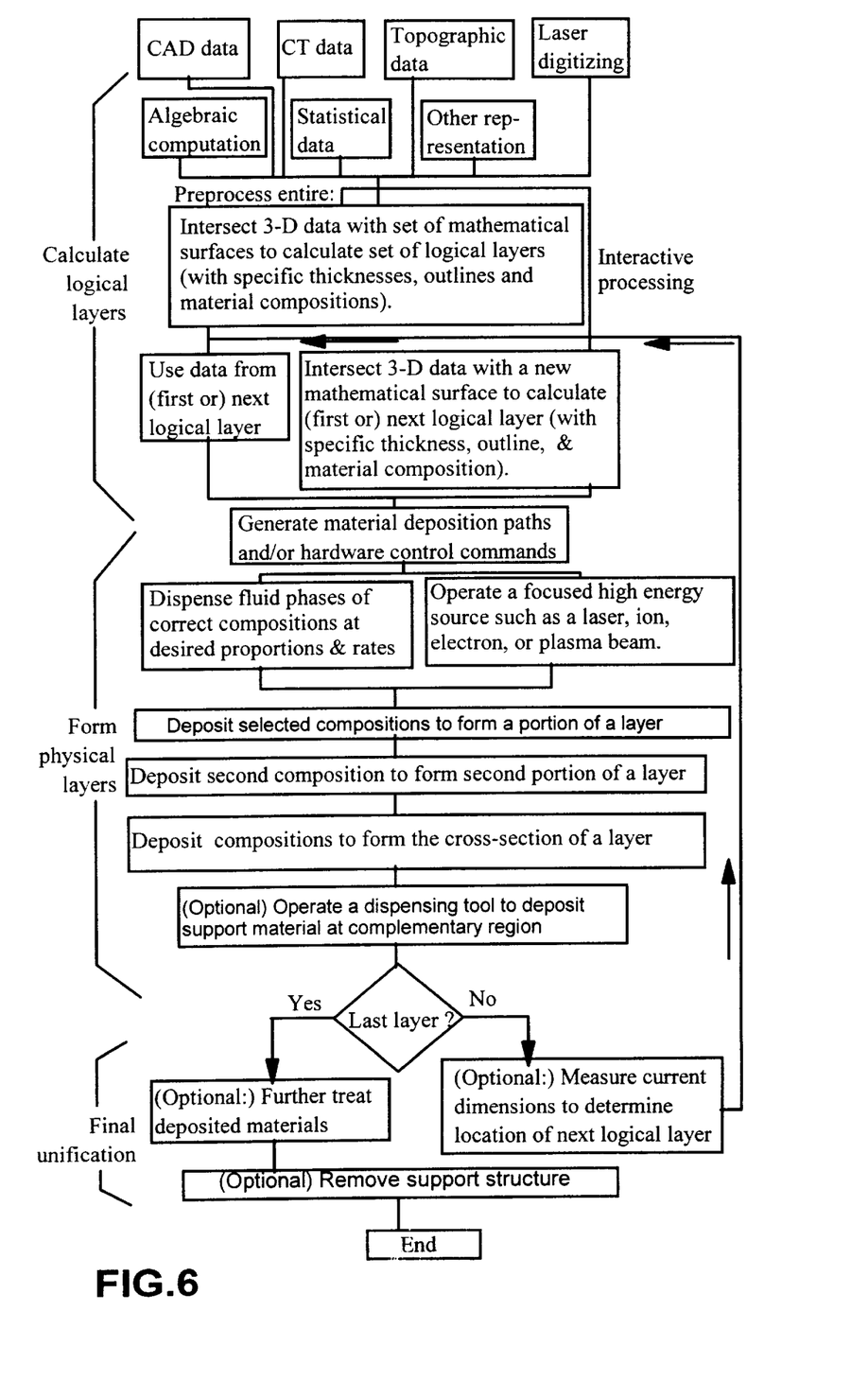
FIG. 6. Flow chart indicating a preferred process that involves using a computer and required software programs for adaptively slicing the image of an object into layer data, for optionally generating data files for support structures, and for controlling various components of the 3-D object building apparatus.

A preferred embodiment of the present invention is a solid freeform fabrication process in which the execution of various steps may be illustrated by the flow chart of FIG. 6. The process begins with the creation of a mathematical model (e.g., via computer-aided design, CAD), which is a data representation of a 3-D object. This model is stored as a set of numerical representations of layers which, together, represent the whole object. A series of data packages, each data package corresponding to the physical dimensions of an individual layer of deposited materials, is stored in the memory of a computer in a logical sequence so that the data packages correspond to individual layers of the materials stacked together to form the object.

Specifically, before the constituent layers of a 3-D object are formed, the geometry of this object is logically divided into a sequence of mutually adjacent theoretical layers, with each theoretical layer defined by a thickness and a set of closed, nonintersecting curves lying in a smooth two-dimensional (2-D) surface. These theoretical layers, which exist only as data packages in the memory of the computer, are referred to as "logical layers." This set of curves forms the "contour" of a logical layer or "cross section". In the simplest situations, each 2-D logical layer is a plane so that each layer is flat, and the thickness is the same throughout any particular layer. However, this is not necessarily so in every case, as a layer may have any desired curvature and the thickness of a layer may be a function of position within its two-dimensional surface. The only constraint on the curvature and thickness function of the logical layers is that the sequence of layers must be logically adjacent. Therefore, in considering two layers that come one after the other in the sequence, the mutually abutting surfaces of the two layers must contact each other at every point, except at such points of one layer where the corresponding point of the other layer is void of material as specified in the object model.

As summarized in the top portion of FIG. 6, the data packages for the logical layers may be created by any of the following methods:

(1) For a 3-D computer-aided design (CAD) model, by logically "slicing" the data representing the model,
(2) For topographic data, by directly representing the contours of the terrain,
(3) For a geometrical model, by representing successive curves which solve "z=constant" for the desired geometry in an x-y-z rectangular coordinate system, and
(4) Other methods appropriate to data obtained by computer tomography (CT), magnetic resonance imaging (MRI), satellite reconnaissance, laser digitizing, line ranging, or other methods of obtaining a computerized representation of a 3-D object.

An alternative to calculating all of the logical layers in advance is to use sensor means to periodically measure the dimensions of the growing object as new layers are formed, and to use the acquired data to help in the determination of where each new logical layer of the object should be, and possibly what the curvature and thickness of each new layer should be. This approach, called "adaptive layer slicing", could result in more accurate final dimensions of the fabricated object because the actual thickness of a sequence of stacked layers may be different from the simple sum of the intended thicknesses of the individual layers.

The closed, nonintersecting curves that are part of the representation of each layer unambiguously divide a smooth two-dimensional surface into two distinct regions. In the present context, a "region" does not mean a single, connected area. Each region may consist of several island-like subregions that do not touch each other. One of these regions is the intersection of the surface with the desired 3-D object, and is called the "positive region" of the layer. The other region is the portion of the surface that does not intersect the desired object, and is called the "negative region." The curves are the boundary between the positive and negative regions, and are called the "outline" of the layer. In the present context, the liquid droplets and the weld pool materials are allowed to be deposited in the "positive region" while a different material may be deposited in certain parts or all of the "negative region" in each layer to serve as a support structure.

As a specific example, the geometry of a three-dimensional object may be converted into a proper format utilizing commercially available CAD or Solid Modeling software. A commonly used format is the stereo lithography file (.STL), which has become a defacto industry standard for layer manufacturing. The object geometry data may be sectioned into multiple layers by a commercially available software program. Each layer has its own shape and dimensions. These layers, each being composed of a plurality of segments, when combined together, will reproduce the complete outline of the intended object. When a variable-composition object is desired, these segments are preferably sorted in accordance with their material compositions. This can be accomplished by taking the following procedure:

When the stereo lithography (.STL) format is utilized, the image is represented by a large number of triangular facets that are connected to simulate the exterior and interior surfaces of the object. The triangles may be so chosen that each triangle covers one and only one material composition. In a conventional .STL file, each triangular facet is represented by three vertex points each having three coordinate points, $(x_1,y_1,z_1)$, $(x_2,y_2,z_2)$, and $(x_3,y_3,z_3)$, and a unit no vector $(i,j,k)$. Each facet is now further endowed with a material composition code. During the slicing step, neighboring data points with the same composition code on the same layer may be sorted together. These segment data are then converted into programmed signals (data for selecting deposition tools and tool paths) in a proper format, such as the standard NC G-codes commonly used in computerized numerical control (CNC) machinery industry. These layering data signals may be directed to a machine controller which selectively actuates the motors for moving the deposition sub-system with respect to the object target surface, activates signal generators, drive the valve means in the fluid phase delivery device, drives the optional vacuum pump means, and operates optional temperature controllers, etc. It should be noted that although .STL file format has been emphasized in this paragraph, many other file formats have been employed in different commercial rapid prototyping and manufacturing systems. These file formats may be used in the presently invented system and each of the constituent segments for the object image may be assigned a composition code.

The three-dimensional motion controller is electronically linked to the mechanical drive means and is operative to actuate the mechanical drive means in response to "X," "Y," "Z" axis drive signals for each layer received from the CAD computer. Controllers that are capable of driving linear motion devices are commonplace. Examples include those commonly used in a milling machine.

Numerous software programs have become available that are capable of performing the presently specified functions. Suppliers of CAD and Solid Modeling software packages for converting CAD drawings into .STL format include SDRC (Structural Dynamics Research Corp. 2000 Eastman Drive, Milford, Ohio 45150), Cimatron Technologies (3190 Harvester Road, Suite 200, Burlington, Ontario L7N 3N8, Canada), Parametric Technology Corp. (128 Technology Drive, Waltham, Mass. 02154), and Solid Works (150 Baker Ave. Ext., Concord, Mass. 01742). Optional software packages may be utilized to check and repair .STL files which are known to often have gaps, defects, etc. AUTOLISP can be used to convert AUTOCAD drawings into multiple layers of specific patterns and dimensions.

Several software packages specifically written for rapid prototyping have become commercially available. These include (1) SOLIDVIEW RP/MASTER software from Solid Concepts, Inc., Valencia, Calif.; (2) MAGICS RP software from Materialise, Inc., Belgium; and (3) RAPID PROTO-TYPING MODULE (RPM) software from Imageware, Ann Arbor, Mich. These packages are capable of accepting, checking, repairing, displaying, and slicing .STL files for use in a solid freeform fabrication system. MAGICS RP is also capable of performing layer slicing and converting object data into directly useful formats such as Common Layer Interface (CLI). A CLI file normally comprises many "polylines" with each polyline being an ordered collection of numerous line segments. These and other software packages (e.g. Bridgeworks from Solid Concepts, Inc.) are also available for identifying an un-supported feature in the object and for generating data files that can be used to build a support structure for the un-supported feature. The support structure may be built by a separate fabrication tool or by the same deposition device that is used to build the object.

A company named CGI (Capture Geometry Inside, currently located at 15161 Technology Drive, Minneapolis, Min.) provides capabilities of digitizing complete geometry of a three-dimensional object. Digitized data may also be obtained from computed tomography (CT) and magnetic resonance imaging (MRI), etc. These digitizing techniques are known in the art. The digitized data may be re-constructed to form a 3-D model on the computer and then converted to .STL files. Available software packages for computer-aided machining include NC Polaris, Smartcam, Mastercam, and EUCLID MACHINIST from MATRA Datavision (1 Tech Drive, Andover, Mass. 01810).

Formation of the Physical Layers

The data packages are stored in the memory of a computer, which controls the operation of a layer manufacturing system comprising a material deposition subsystem, an object target surface, and motion devices. Using these data packages, the computer controls the manufacturing system to manipulate the fabrication materials to form individual layers of materials in accordance with the specifications of an individual data package. The fluid phase compositions used to form the layer contours have the property that they can be readily induced by a focused energy beam to become deposited and consolidated layer-by-layer.

As indicated earlier, the fabrication materials do not have to be homogeneous. They may, for example, exhibit variations in composition based upon the structural or physical requirements of the desired object begin built. These variations may serve to accomplish internal variations of the physical properties of the object, such as hardness, mass density, and coefficient of thermal expansion and variations of external appearance such as color patterns. In one preferred embodiment, the fluid phase compositions may be deposited to comprise a spatially controlled material composition comprising two or more distinct types of materials. In a further specific embodiment, the materials may be deposited in continuously varying concentrations of distinct types of materials. These material composition variations can be readily accomplished by operating the presently discussed multiple-channel fluid phase delivery device.

If composition variation of a deposition material is desired within any particular layer, and if the mechanism (e.g., in FIG. 2) for depositing the fabrication material has the capability of depositing the required various compositions automatically, then the variation in composition may be represented mathematically within the data package for each layer, and the mathematical representation may be used to control the composition of materials deposited. However, if the mechanism for depositing a material is limited to providing layers of any one specific composition at a time, then variations in composition may be accomplished by logically separating a particular layer into sub-layers, where each sub-layer is composed of a different material, and the union of the sub-layers is equal to the particular layer. Each sub-layer is then treated as a distinct layer in the deposition process, and the complete layer is formed by the formation and bonding of a succession of its constituent sub-layers. If the interface between sub-layers is along surfaces perpendicular to the layers, and not along surfaces parallel to the layers, then the bonding of each sub-layer is not to the previous sub-layer, but to the previous complete layer.

As another embodiment of the present invention, therefore, a solid freeform fabrication process may comprise the steps of (1) positioning a material deposition sub-system a selected distance from a target surface; (2) operating this sub-system to deposit materials onto the target surface; and (3) during this material deposition process, moving the deposition sub-system and the work surface relative to one another in a plane defined by first and second directions (X- and Y-directions) and in a third direction (Z-) orthogonal to the X-Y plane to form a three-dimensional shape. The deposition step comprises the steps of (a) operating a multiple-channel fluid phase delivery device for supplying multiple fluid compositions onto selected spots proximate the target surface and (b) operating a focused energy source to produce a phase change zone proximate the target surface. These two steps, (a) and (b), may be carried out in a predetermined sequence. Preferably, materials of predetermined compositions are deposited point by point and/or layer by layer; material composition may vary from point to point and/or from layer to layer.

Specifically, the above-cited moving step preferably includes the steps of (a) moving the material deposition sub-system and target surface relative to one another in a direction parallel to the X-Y plane to form a first layer of the materials on the target surface; (b) moving the deposition sub-system and the work surface away from each other by a predetermined layer thickness; and (c) depositing a second layer of the materials onto the first layer while simultaneously moving the work surface and the deposition sub-system relative to one another in a direction parallel to the X-Y plane, whereby the second layer solidifies and adheres to the first layer.

Preferably, the process further comprises additional steps of forming multiple layers of the materials on top of one another by repeated depositing of materials from the phase change zone as the target surface and the deposition sub-system are moved relative to one another in a direction parallel to the X-Y plane, with the deposition sub-system and the target surface being moved away from one another in the Z-direction by a predetermined layer thickness after each preceding layer has been formed, and with the depositing of each successive layer being controlled to take place after the material in the preceding layer immediately adjacent the nozzle has substantially solidified. These steps can be accomplished by operating the apparatus described above either manually or, preferably, under the control of a computer system.

Therefore, another preferred embodiment is a process as set forth in the above three steps, (1) through (3) plus (a) and (b), further comprising the steps of (4) creating a geometry of the 3-D object on a computer with the geometry including a plurality of segments defining the object; (5) generating programmed signals corresponding to each of these segments in a predetermined sequence; and (6) moving the deposition sub-system and the target surface relative to one another in response to the programmed signals. These additional steps provide computerized control over the relative motions between the deposition sub-system and the target surface to build a 3-D object. However, the material composition distribution pattern of an object is not necessarily predetermined (albeit preferably so). The adjustments of compositions for different portions of an object can be made at any time during the object building process or in a random fashion, if so desired.

If a predetermined material distribution pattern is desired before the object building process begins, then this pattern may be defined by attaching a material composition code to each of the constituent segments defining the object. When the computer reads a specific code, during the object building process, it will send out proper control signals to select the correct channels for dispensing fluid phases of selected compositions into the phase change zone. Therefore, another embodiment of the present invention is a process as set forth in the above three steps, (1) through (3), but further comprising the steps of (c) creating a geometry of the object on a computer with the geometry including a plurality of segments defining the object and with each of the segments being coded with a material composition defined by the operation of a specific set of selected fluid phase delivery channels; (d) generating programmed signals corresponding to each of these segments in a predetermined sequence; (e) operating the pulse generator (actuator means) in response to the programmed signals to activate selected channels; and (f) moving the deposition sub-system and the target surface relative to one another in response to the programmed signals.

As indicated earlier, the most popular file format used by all commercial rapid prototyping machines is the .STL format. The .STL file format describes a CAD model's surface topology as a single surface represented by triangular facets. By slicing through the CAD model simulated by these triangles, one would obtain coordinate points that define the boundaries of each cross section. It is therefore convenient for a dispensing nozzle to follow these coordinate points to trace out the perimeters of a layer cross section. These perimeters may be built with a proper material composition pattern to form an outer boundary of the object. The outer boundary demarcates a positive region (to be filled by materials as a part of a layer) from a negative region.

In one preferred embodiment, the negative region of a layer may be filled with an inert material (preferably by using a separate deposition tool) before beginning to build a subsequent layer. This inert material may just serve as a support structure or as a protective structure. In a multi-layer microelectronic device, this inert material may be an electrically insulating material such as an epoxy or polyimide resin. This deposition tool can be just an extrusion device, a sprayer, and an inkjet print-head, etc. These tools are commonly used in other layer manufacturing processes. A portion or all of the support structure may be removed upon deposition of a subsequent layer or completion of the whole object. If it is desirable to remove a portion or all of the support structure, one may select any material that can be easily removed with a simple physical or chemical mean. For instance, one may choose to use a lower melting point material as a support material, which can be readily removed by heating.

This outer boundary also defines an interior space in the object. Hence, the moving step may further include the step of moving the deposition sub-system and the target surface relative to one another in one direction parallel to the X-Y plane according to at least one other predetermined pattern to fill this interior space with selected materials. The interior does not have to have the same material composition as the exterior boundary. The interior space may be built with materials of a spatially controlled composition comprising one or more distinct types of materials. The materials may be deposited in continuously varying concentrations of distinct types of materials. This process may further comprise the steps of (h) creating a geometry of the object on a computer with the geometry including a plurality of segments defining the object; and (i) generating program signals corresponding to each of these segments in a predetermined sequence, wherein the program signals determine the movement of the deposition sub-system and the work surface relative to one another in the first predetermined pattern and at least one other predetermined pattern.

The above procedures of delineating a boundary of a cross section and filling in the interior space of the cross section may be automated by using a computer system. This can be achieved by taking the following steps: (j) creating a geometry of the object on a computer with the geometry including a plurality of segments defining the object; (k) generating program signals corresponding to each of the segments in a predetermined sequence; (l) activating at least one fluid phase channel to dispense selected deposition materials; and (m) during this dispensing step, moving the deposition sub-system and the object target surface in response to the programmed signals relative to one another in the X-Y plane and in the Z-direction in a predetermined sequence of movements such that the deposition materials are dispensed in free space as a plurality of segments sequentially formed so that the last dispensed segment overlies at least a portion of the preceding segment in contact therewith to thereby form the object.

As another preferred embodiment, a layer manufacturing process comprises the steps of (A) creating a geometry of a 3-D object on a computer with the geometry including a plurality of segments defining this object and each segment being coded with a material composition; (B) evaluating the data files representing the object to locate any un-supported feature (such as an overhang or isolated island) of the object, which is followed by determining a support structure for the un-supported feature and creating a plurality of segments defining the support structure; (C) generating program signals corresponding to each of these constituent segments for both the object being built and the support structure in a predetermined sequence; (D) providing at least one material composition for the object and one composition for the support structure; (E) feeding the fluid phase compositions to selected deposition channels; (F) operating a focused energy source to produce a phase change zone proximate the target surface; (G) operating a separate dispensing tool to deposit a support structure material; (H) during these material deposition steps, (E), (F) and (G), moving the deposition sub-system and the work surface in response to the programmed signals relative to one another in the X-Y plane and in the Z-direction in a predetermined sequence of movements such that the materials are deposited in free space as a plurality of segments sequentially formed so that the last dispensed segment overlies at least a portion of the preceding segment in contact therewith to thereby form the support structure and the three-dimensional object.

What is claimed:

1. Solid freeform fabrication apparatus for making a three-dimensional object, comprising:
   (a) a target surface;
   (b) a material deposition sub-system comprising
       a fluid phase delivery device, disposed a distance from said target surface, said device comprising (1) a phase change chamber having a discharge opening of a predetermined size smaller than 1 mm in diameter on one side of said chamber proximal said target surface, (2) a multiplicity of flow channels with each channel having first and second ends, said first end being supplied with a precursor fluid phase composition and said second end having an orifice of a predetermined size to supply said fluid phase composition therethrough into said phase change chamber, and (3) flow control means located in control relation to each of said channels for regulating the flow of said fluid phase composition through said orifice into said phase chamber and then dispensing said fluid phase composition through said discharge opening; said dispensed fluid phase composition moving from said opening toward said target surface, forming a narrow travel path;

a focused energy beam, disposed a distance from said fluid phase delivery device, and operative to intersect said travel path producing a phase change zone in which said fluid phase composition undergoes a chemical reaction and/or physical transition for depositing materials onto said target surface;

(c) motion devices coupled to said target surface and said material deposition sub-system for moving said deposition sub-system and said target surface relative to one another along selected directions in a plane defined by first and second coordinate directions and in a third coordinate direction orthogonal to said plane to form said deposition materials into a three-dimensional shape.

2. Apparatus as set forth in claim 1, wherein said focused energy beam comprises a laser beam.

3. Apparatus as set forth in claim 1, further comprising:

a computer-aided design computer and supporting software programs operative to create a three-dimensional geometry of a desired object, to convert said geometry into a plurality of segments defining the object, and to generate programmed signals corresponding to each of said segments in a predetermined sequence; and a machine controller electronically linked to said computer and said motion devices and operative to drive said motion devices in response to said programmed signals for each of said segments received from said computer.

4. Apparatus as set forth in claim 3 wherein said machine controller and said computer comprise means for controlling said flow control means for regulating and directing the flow of said fluid phase compositions.

5. Apparatus as set forth in claim 1 wherein said flow control means comprises a flow facilitator system for directing the flow of said dispensed fluid phase compositions and/or removing exhaust and unused fluid phase compositions near said phase change zone.

6. Apparatus as set forth in claim 3, wherein said material deposition sub-system further comprises a separate material dispensing tool a distance from said phase change chamber and said supporting software programs comprise:

means for evaluating the data files representing the geometry of said object to locate any un-supported feature of the object;

means, responsive to the evaluating means locating an un-supported feature, for defining a support structure for said un-supported feature;

means for creating a plurality of segments defining said support structure; and means for generating programmed signals required by said separate material dispensing tool to fabricate said support structure.

7. Apparatus as set forth in claim 3, further comprising:

sensor means electronically linked to said computer and operative to periodically provide layer dimension data to said computer;

supporting software programs in said computer operative to perform adaptive layer slicing to periodically create a new set of layer data comprising segments defining the object in accordance with said layer dimension data acquired by said sensor means, and to generate programmed signals corresponding to each of said segments in a predetermined sequence.

8. Apparatus as set forth in claim 1 wherein said fluid phase delivery device is positioned below said target surface in such a fashion that the material deposition takes place upwardly from underneath said target surface.

9. A freeform fabrication process for making a three-dimensional object, said process comprising the steps of:

positioning a material deposition sub-system a selected distance from a target surface;

said material deposition sub-system comprising a focused energy beam and a multi-channel fluid phase delivery device that introduces selected fluid phase compositions into a phase change chamber having a discharge openings smaller than 1 mm in diameter on one side of said chamber proximate said target surface;

operating said sub-system to deposit materials onto said target surface comprising the sub-steps of (a) operating said multiple-channel fluid phase delivery device for dispensing and directing said fluid phase compositions to flow through said discharge opening toward said target surface, said fluid phase flow forming a travel path; (b) operating said focused energy beam to intersect said travel path for producing a phase change zone in which said fluid phase compositions are activated to undergo a chemical reaction and/or physical transition, thereby inducing deposition of materials onto said target surface;

during said material deposition process, moving said deposition sub-system and said target surface relative to one another along selected directions in a plane defined by first and second coordinate directions and in a third coordinate direction orthogonal to said plane to form deposition materials into a three dimensional shape.

10. A process as set forth in claim 9, wherein the moving step includes the sub-steps of:

(a) moving said deposition sub-system and said target surface relative to one another in a direction parallel to said plane to form a first portion of a first layer from first fluid phase composition onto said target surface;

(b) moving said deposition sub-system and said target surface relative to one another in a direction parallel to said plane to form a second portion of said first layer from a second fluid phase composition onto said target surface;

(c) repeating step (b) for completing the deposition of materials of predetermined compositions for said first layer;

(d) moving said material deposition sub-system and said target surface away from one another in said third direction by a predetermined layer thickness; and (e) dispensing and depositing a second layer of predetermined materials from a second set of fluid phase compositions onto said first layer while simultaneously moving said target surface and said deposition sub-system relative to one another in a direction parallel to said plane, whereby said second layer adheres to said first layer.

11. A process as set forth in claim 10, comprising additional steps of forming multiple layers of said deposition materials on top of one another by repeated dispensing and depositing of said deposition materials from said deposition sub-system as said target surface and said deposition sub-system are moved relative to one another along selected directions parallel to said plane, with said deposition sub-system and said target surface being moved away from one another in said third direction by a predetermined layer thickness after each preceding layer has been formed.

12. A process as set forth in claim 9, further comprising the steps of:
creating a geometry of said three-dimensional object on a computer with said geometry including a plurality of segments defining the object;
generating programmed signals corresponding to each of said segments in a predetermined sequence; and
moving said deposition sub-system and said target surface relative to each other in response to said programmed signals.

13. A process as set forth in claim 9, further comprising the steps of:
creating a geometry of said three-dimensional object on a computer with said geometry including a plurality of segments defining the object; each of said segments being coded with a selected material composition corresponding to one or more of said fluid phase compositions combined at a predetermined proportion;
generating programmed signals corresponding to each of said segments in a predetermined sequence;
operating said material deposition sub-system in response to said programmed signals to selectively dispense and deposit said selected deposition materials;
moving said deposition sub-system and said target surface relative to one another in response to said programmed signals.

14. A process as set forth in claim 9, wherein said moving step includes the step of moving said deposition sub-system and said target surface relative to one another in a direction parallel to said plane according to a first predetermined pattern to form an outer boundary from selected fluid phase compositions on said target surface, said outer boundary defining an exterior surface of said object.

15. A process as set forth in claim 14, wherein said outer boundary defines an interior space in said object, and said moving step further includes the step of moving said deposition sub-system and said target surface relative to one another in one direction parallel to said plane according to at least one other predetermined pattern to fill said interior space with selected deposition materials.

16. A process as set forth in claim 15, further comprising the steps of:
creating a geometry of said three-dimensional object on a computer, said geometry including a plurality of segments defining said object; and
generating program signals corresponding to each of said segments in a predetermined sequence, wherein said program signals determine said movement of said deposition sub-system and said target surface relative to one another in said first predetermined pattern and said at least one other predetermined pattern.

17. A process as set forth in claim 15 wherein said interior space is deposited with a spatially controlled material composition comprising two or more distinct types of materials.

18. A process as set forth in claim 17 wherein said interior space is deposited with a material composition in continuously varying concentrations of distinct materials in three-dimensional part space to form a spatially controlled material composition part.

19. A process as set forth in claim 17 wherein said distinct types of materials are deposited at discrete locations in three-dimensional part space to form a spatially controlled material composition part.

20. A process as set forth in claim 9, further comprising using dimension sensor means to periodically measure dimensions of the object being built;
using a computer to determine the thickness and outline of individual layers of said deposition materials in accordance with a computer aided design representation of said object; said computing step comprising operating said computer to calculate a first set of logical layers with specific thickness and outline for each layer and then periodically re-calculate another set of logical layers after periodically comparing the dimension data acquired by said sensor means with said computer aided design representation in an adaptive manner.

21. A process as set forth in claim 9, wherein said operation of a deposition sub-system includes the operation of a separate material dispensing tool and wherein said process further comprises the steps of:
creating a geometry of said three-dimensional object on a computer with said geometry including a plurality of segments defining the object;
evaluating the data files representing said object to locate any un-supported feature of the object and, responsive to said evaluation step, determining a support structure for the un-supported feature and creating a plurality of segments defining said support structure;
generating program signals corresponding to each of said segments for both said object and said support structure in a predetermined sequence;
moving said deposition sub-system and said work surface relative to each other in response to said programmed signals for said material deposition sub-system to build said object and said support structure.

22. A process as set forth in claim 9, wherein said operation of a deposition sub-system includes the operation of a separate material dispensing tool and wherein said process further comprises the steps of:
creating a geometry of said three-dimensional object on a computer with said geometry including a plurality of segments defining the object;
evaluating the data files representing said object to locate any un-supported feature of the object and, responsive to said evaluation step, determining a support structure for the un-supported feature and creating a plurality of segments defining said support structure; each of said segments for the object and the support structure being coded with a selected material composition;
generating programmed signals corresponding to each of said segments in a predetermined sequence;
operating said material deposition sub-system in response to said programmed signals to selectively dispense and deposit said selected deposition materials; and
moving said deposition sub-system and said target surface relative to one another in response to said programmed signals for building said object and said support structure.

23. A process as set forth in claim 9, wherein said fluid phase delivery device is positioned below said target surface so that the deposition of materials takes place substantially upward from underneath.

24. Apparatus as set forth in claim 1, wherein said focused energy beam comprises an ion beam.

25. Apparatus as set forth in claim 1, wherein said focused energy beam comprises an electron beam.

26. Apparatus as set forth in claim 1, wherein said focused energy beam comprises a focused plasma beam.

27. Apparatus as set forth in claim 1, wherein said discharge opening of said phase change chamber is smaller than 10 $\mu$m in diameter.

* * * * *